United States Patent
Cohen

(10) Patent No.: US 10,346,312 B2
(45) Date of Patent: *Jul. 9, 2019

(54) VARIABLE-SIZE FLASH TRANSLATION LAYER

(71) Applicant: Seagate Technology LLC, Cupertino, CA (US)

(72) Inventor: Earl T. Cohen, Oakland, CA (US)

(73) Assignee: Seagate Technology LLC, Cupertino, CA (US)

( * ) Notice: Subject to any disclaimer, the term of this patent is extended or adjusted under 35 U.S.C. 154(b) by 295 days.

This patent is subject to a terminal disclaimer.

(21) Appl. No.: 15/338,718

(22) Filed: Oct. 31, 2016

(65) Prior Publication Data

US 2017/0046273 A1    Feb. 16, 2017

Related U.S. Application Data

(63) Continuation of application No. 14/055,336, filed on Oct. 16, 2013, now Pat. No. 9,495,288.

(Continued)

(51) Int. Cl.
*G06F 12/1009* (2016.01)
*G06F 12/02* (2006.01)
(Continued)

(52) U.S. Cl.
CPC .......... *G06F 12/1009* (2013.01); *G06F 3/064* (2013.01); *G06F 3/0619* (2013.01);
(Continued)

(58) Field of Classification Search
None
See application file for complete search history.

(56) References Cited

U.S. PATENT DOCUMENTS

| | | | |
|---|---|---|---|
| 5,937,425 A | 8/1999 | Ban | 711/103 |
| 5,960,465 A | 9/1999 | Adams | 710/68 |

(Continued)

FOREIGN PATENT DOCUMENTS

| | | | |
|---|---|---|---|
| CN | 1725216 A | 4/2005 | G06F 17/30 |
| CN | 102567132 A | 12/2011 | G06F 11/10 |
| WO | WO2012-154980 A1 | 5/2012 | |

OTHER PUBLICATIONS

"DFTL: A Flash Translation Layer Employing Demand-based Selective Caching of Page-level Address Mappings" by Asyush Gupta et al., copyright 2009, ACM.

(Continued)

*Primary Examiner* — Steven G Snyder
(74) *Attorney, Agent, or Firm* — Hall Estill Attorneys at Law

(57) ABSTRACT

A method for using a variable-size flash translation layer. The method includes reading an entry in a map based on a read logical block address in a read request to obtain both a physical address of a particular page in a memory and information regarding compressed data with a variable size; converting the information to both an address in the particular page and a number of read units in the memory that contain the compressed data; and reading the compressed data from at least the particular page in the memory based on the address and the number of read units.

20 Claims, 8 Drawing Sheets

Related U.S. Application Data

(60) Provisional application No. 61/888,681, filed on Oct. 9, 2013, provisional application No. 61/866,672, filed on Aug. 16, 2013, provisional application No. 61/755,169, filed on Jan. 22, 2013.

(51) Int. Cl.

| | | |
|---|---|---|
| *G06F 11/10* | (2006.01) | |
| *G11C 29/52* | (2006.01) | |
| *G11C 16/08* | (2006.01) | |
| *G06F 3/06* | (2006.01) | |
| *G06F 12/10* | (2016.01) | |
| *G11C 29/04* | (2006.01) | |
| *G06F 12/04* | (2006.01) | |

(52) U.S. Cl.
CPC .......... *G06F 3/0659* (2013.01); *G06F 3/0661* (2013.01); *G06F 3/0679* (2013.01); *G06F 11/1068* (2013.01); *G06F 12/02* (2013.01); *G06F 12/0246* (2013.01); *G06F 12/0292* (2013.01); *G06F 12/10* (2013.01); *G11C 16/08* (2013.01); *G11C 29/04* (2013.01); *G11C 29/52* (2013.01); *G06F 12/04* (2013.01); *G06F 2212/2022* (2013.01); *G06F 2212/401* (2013.01); *G06F 2212/7201* (2013.01); *G06F 2212/7202* (2013.01)

(56) References Cited

U.S. PATENT DOCUMENTS

| | | | |
|---|---|---|---|
| 6,374,341 B1 | 4/2002 | Nijhawan et al. | 711/207 |
| 7,552,271 B2 | 6/2009 | Sinclair et al. | 711/103 |
| 7,594,062 B2 | 9/2009 | In et al. | 711/103 |
| 7,644,251 B2 | 1/2010 | Sanders et al. | 711/103 |
| 8,041,878 B2 * | 10/2011 | Lee | G06F 3/0616 711/103 |
| 8,219,776 B2 | 7/2012 | Forhan et al. | 365/185.33 |
| 8,417,914 B2 | 4/2013 | Manning et al. | 711/103 |
| 8,533,558 B2 | 9/2013 | Yurzola et al. | 714/758 |
| 8,533,564 B2 | 9/2013 | Yurzola et al. | 714/763 |
| 8,799,614 B2 | 8/2014 | Mansson et al. | 707/693 |
| 8,843,711 B1 | 9/2014 | Yadav et al. | 711/154 |
| 8,898,424 B2 | 11/2014 | Manning et al. | 711/103 |
| 9,195,594 B2 * | 11/2015 | Cohen | G06F 12/0246 |
| 9,218,281 B2 * | 12/2015 | Cohen | G06F 12/0246 |
| 9,268,682 B2 * | 2/2016 | Tomlin | G06F 12/0246 |
| 9,274,973 B2 | 3/2016 | Manning et al. | |
| 9,298,384 B2 | 3/2016 | Kang et al. | |
| 9,329,991 B2 | 5/2016 | Cohen et al. | |
| 9,343,153 B2 | 5/2016 | Kawamura et al. | |
| 9,396,104 B1 * | 7/2016 | Danilak | G06F 3/0679 |
| 9,454,474 B2 * | 9/2016 | Tomlin | G06F 12/0246 |
| 9,477,406 B2 * | 10/2016 | Cohen | G06F 12/0246 |
| 9,489,296 B1 * | 11/2016 | Tomlin | G06F 12/0253 |
| 9,507,523 B1 * | 11/2016 | Mullendore | G06F 3/0679 |
| 9,514,057 B2 * | 12/2016 | Marcu | G06F 12/1009 |
| 9,817,577 B2 * | 11/2017 | Tomlin | G06F 12/0246 |
| 2003/0014609 A1 | 1/2003 | Kissell | 711/206 |
| 2007/0143569 A1 | 6/2007 | Sanders et al. | 711/203 |
| 2010/0017578 A1 | 1/2010 | Mansson et al. | 711/171 |
| 2011/0060887 A1 | 3/2011 | Thatcher et al. | 711/171 |
| 2011/0154158 A1 | 6/2011 | Yurzola et al. | 714/758 |
| 2011/0154160 A1 | 6/2011 | Yurzola et al. | 714/763 |
| 2012/0030408 A1 | 2/2012 | Flynn et al. | 711/102 |
| 2012/0117303 A1 * | 5/2012 | Carannante | G06F 12/0246 711/103 |
| 2012/0179853 A1 | 7/2012 | Manning et al. | 711/3 |
| 2012/0203955 A1 * | 8/2012 | Kim | G06F 12/0246 711/103 |
| 2012/0284587 A1 * | 11/2012 | Yu | G06F 3/0608 714/773 |
| 2013/0117503 A1 | 5/2013 | Nellans et al. | 711/103 |
| 2013/0166831 A1 | 6/2013 | Atkisson et al. | 711/103 |
| 2013/0227247 A1 | 8/2013 | Manning et al. | 711/206 |
| 2013/0246689 A1 * | 9/2013 | Matsudaira | G06F 12/0246 711/103 |
| 2013/0326119 A1 | 12/2013 | Lee et al. | 711/103 |
| 2014/0040530 A1 * | 2/2014 | Chen | G06F 11/1068 711/103 |
| 2014/0101369 A1 * | 4/2014 | Tomlin | G06F 12/0246 711/103 |
| 2014/0208004 A1 | 7/2014 | Cohen et al. | 711/103 |
| 2014/0223089 A1 | 8/2014 | Kang et al. | 711/103 |
| 2014/0297990 A1 | 10/2014 | Manning et al. | 711/206 |
| 2015/0106556 A1 * | 4/2015 | Yu | G11C 16/349 711/103 |
| 2015/0154118 A1 | 6/2015 | Marcu et al. | 711/206 |
| 2016/0291869 A1 * | 10/2016 | Yi | G06F 3/061 |
| 2018/0024748 A1 * | 1/2018 | Hahn | G06F 3/0608 711/154 |
| 2018/0246664 A1 * | 8/2018 | Wu | G11C 16/06 |
| 2018/0293174 A1 * | 10/2018 | Song | G06F 3/0688 |
| 2018/0349266 A1 * | 12/2018 | Canepa | G06F 12/0246 |
| 2019/0012094 A1 * | 1/2019 | Li | G06F 3/0611 |

OTHER PUBLICATIONS

"A Superblock-based Flash Translation Layer for NAND Flash Memory" by Jeong-Uk Kang et al., copyright 2006, ACM.
"Efficient Flash Translation layer for Flash Memory" by Shinde Pratibha et al., International Journal of Scientific and Research Publications, vol. 3, Issue 4, Apr. 2013.

* cited by examiner

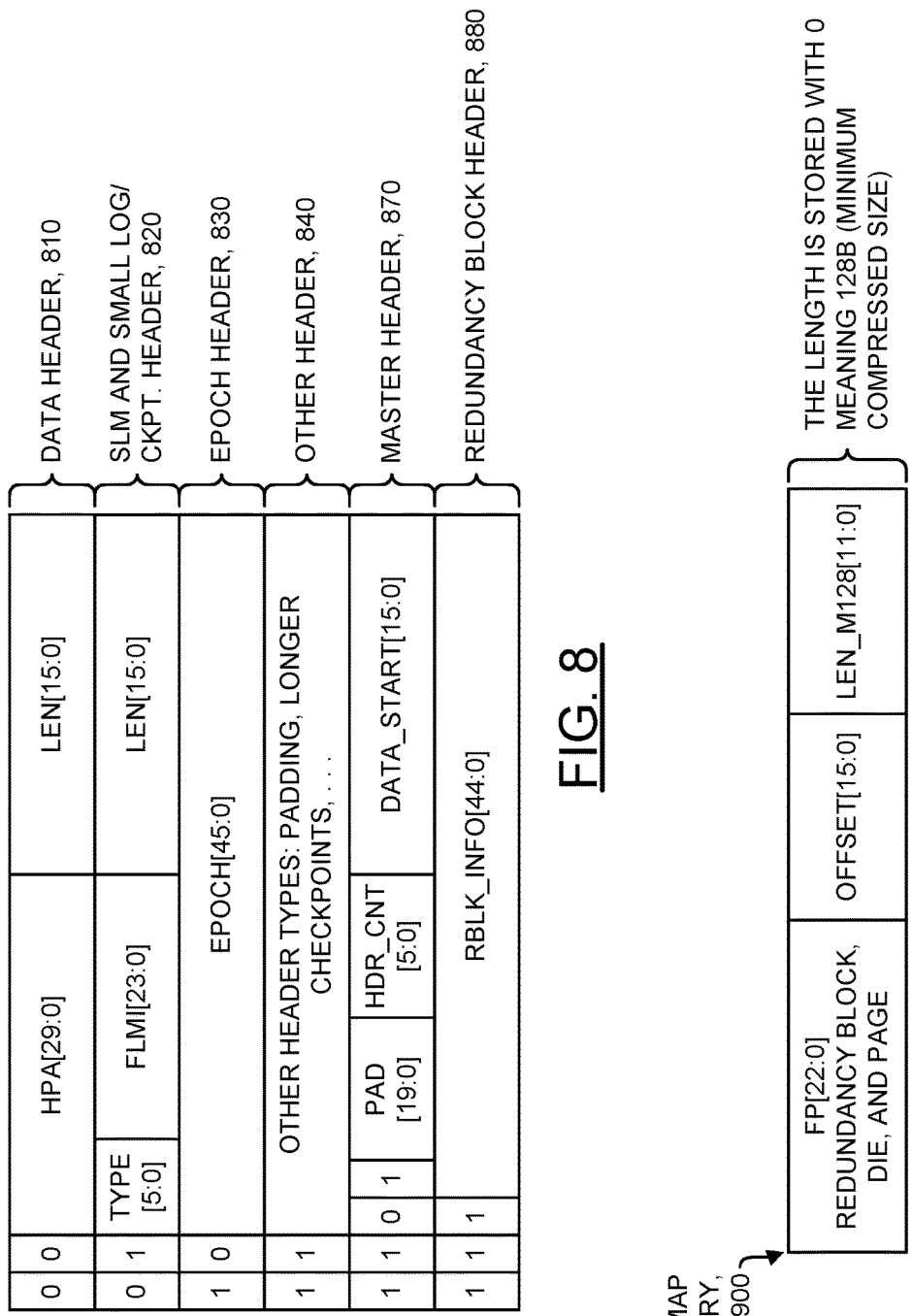

| 1 | FP[22:0] REDUNDANCY BLOCK, DIE, AND PAGE | OFFSET[15:0] | LEN_M128[11:0] |
|---|---|---|---|
| 0 | 0 | OFFSET[15:0] | LEN_M128[11:0] |
| 0 | 1 | 0 | LEN_M128[11:0] |
| 0 | 1 | 1 | |

- UNCOMPRESSED, 1010
- SAME FP, 1020
- OFFSET == PREVIOUS OFFSET + PREVIOUS LEN_M128 + 128, 1030
- OFFSET == PREVIOUS OFFSET + PREVIOUS LEN_M128 + 128 AND LEN_M128 MATCHES PREVIOUS, 1040

FIG. 10

VARIABLE-SIZE FLASH TRANSLATION LAYER

This application relates to U.S. application Ser. No. 14/055,336, filed Oct. 16, 2013, U.S. Provisional Application No. 61/888,681, filed Oct. 9, 2013, U.S. Provisional Application No. 61/866,672, filed Aug. 16, 2013, and U.S. Provisional Application No. 61/755,169, filed Jan. 22, 2013, each of which are hereby incorporated by reference in their entirety.

This application relates to U.S. Ser. No. 13/053,175, filed Mar. 21, 2011, which relates to U.S. Provisional Application No. 61/316,373, filed Mar. 22, 2010, each of which are hereby incorporated by reference in their entirety.

This application also relates to International Application PCT/US2012/058583, with an International Filing Date of Oct. 4, 2012, which claims the benefit of U.S. Provisional Application No. 61/543,707, filed Oct. 5, 2011, each of which are incorporated by reference in their entirety.

FIELD OF THE INVENTION

The invention relates to computing host and input/output device technology generally and, more particularly, to a method and/or apparatus for implementing a variable-size flash translation layer.

BACKGROUND

Conventional solid state drives store a fixed, integer number of host logical blocks in each page of nonvolatile memory. Storage efficiency issues arise when either a user data size or a usable size of each page of the nonvolatile memory is not fixed. Architectures for variable size flash translation layers in the solid state drives are hardware intense. Page headers are used to identify where the user data is stored among multiple read units within the pages of the solid state drive, and extracting the data involves first reading and parsing the page headers.

SUMMARY

The invention concerns a method for using a variable-size flash translation layer. The method includes reading an entry in a map based on a read logical block address in a read request to obtain both a physical address of a particular page in a memory and information regarding compressed data with a variable size; converting the information to both an address in the particular page and a number of read units in the memory that contain the compressed data; and reading the compressed data from at least the particular page in the memory based on the address and the number of read units.

BRIEF DESCRIPTION OF THE FIGURES

Embodiments of the invention will be apparent from the following detailed description and the appended claims and drawings in which:

FIG. 8 is an illustration of selected details of an embodiment of various types of headers;

FIG. 9 is an illustration of selected details of an embodiment of a map entry;

FIG. 10 is an illustration of selected details of an embodiment of various compressed map entries;

DETAILED DESCRIPTION OF THE EMBODIMENTS

Figure 1:
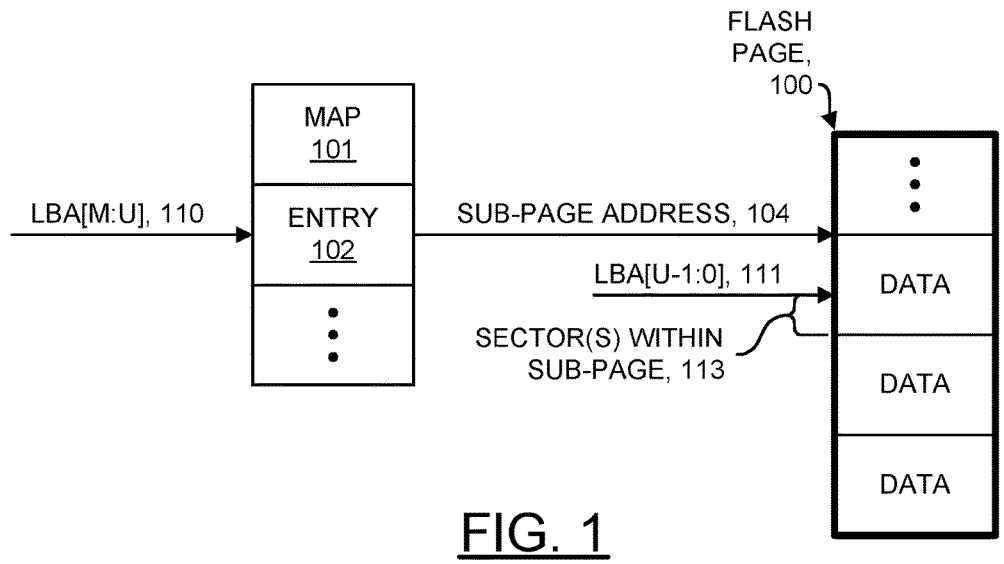
FIG. 1 is an illustration of selected details of an embodiment of mapping of a logical block address to fixed-sized regions within a flash page.

Embodiments of the invention include providing a variable-size flash translation layer that may (i) support a wide range of data sizes, (ii) create headers with a tiling process, (iii) parse headers with an un-tiling process, (iv) place all headers at a start of each page, (v) place all data after the headers in each page, (vi) use offsets and headers not aligned to read unit boundaries and/or (vii) be implemented as one or more integrated circuits and/or associated firmware.

The invention may be implemented in numerous ways, for example, as a process, an article of manufacture, an apparatus, a system, a composition of matter, and a computer readable medium such as a computer readable storage medium (e.g., media in an optical and/or magnetic mass storage device such as a disk, an integrated circuit having nonvolatile storage such as flash storage), or a computer network wherein program instructions are sent over optical or electronic communication links. The detailed description provides an exposition of one or more embodiments of the invention that enable improvements in cost, profitability, performance, efficiency, and utility of use in the field identified above. The detailed description includes an introduction to facilitate understanding of the remainder of the detailed description. The introduction includes example embodiments of one or more of systems, methods, articles of manufacture, and computer readable media in accordance with concepts described herein. As is discussed in more detail, the invention encompasses all possible modifications and variations within the scope of the issued claims.

Flash translation layers (e.g., FTLs) map logical block addresses (e.g., LBAs) in a logical block address space (such as used by a host to perform input/output operations to an input/output device) to physical locations in a nonvolatile memory (e.g., NVM), such as a NAND flash nonvolatile memory. The mapping operates on aligned units of one or more logical blocks, termed a mapping unit, such that each mapping unit has a corresponding physical location where data of the mapping unit is stored (including the possibility of a NULL physical location if the mapping unit has never been written or is trimmed). For example, with 4 kilobyte (e.g., KB) mapping units, eight contiguous (and typically eight-sector aligned) Serial Advanced Technology Attachment (e.g., SATA) 512 byte sectors are mapped as a single unit. Generally, a translation table, such as a map, has an entry per mapping unit to store a respective translation from the logical block address associated with the mapping unit to a physical address in the nonvolatile memory and/or other control information.

Nonvolatile memories, such as NAND flash, provide a writeable (or programmable) unit called a flash page. A flash page comprises a number of user (non-error correction code) data bytes and an amount of spare space for meta-data and error correction coding (e.g., ECC), and is generally a smallest writable unit of the nonvolatile memory. Typical flash page sizes are 8 KB or 16 KB or 32 KB of user data, whereas typical mapping unit sizes are 4 KB or 8 KB. (While the term "user" data is used with respect to flash pages, some flash pages store "system" data such as map data and/or checkpoint data. User data is intended to refer in general to non-ECC portions of a flash page.) The flash pages are organized into blocks, typically 128, 256, or 512 flash pages per block. A block is the minimum-sized unit that can be erased, and a flash page is erased before the page is able to be (re)written.

Referring to FIG. 1, an illustration of selected details of an embodiment of mapping of a logical block address to fixed-sized regions within a flash page is shown. Traditional flash translation layers assume a number of user data bytes in a flash page (e.g., Flash Page 100) is a power-of-two (and/or a multiple of the sector size), and divide the flash page into an integer number of mapping units (each shown as DATA in FIG. 1). For example, with 16 KB of user data per flash page and 4 KB mapping units, each flash page contains four mapping units, and the flash translation layer maps an address of each mapping unit (e.g., LBA[M:U] 110) to a respective flash page and one of the four mapping units within the respective flash page. That is, each map entry contains respective fields such as:

flash_page_address[n−1:0], mapping_unit_within_flash_page[k−1:0] where the flash_page_address refers to a unique flash page in the nonvolatile memory, and the mapping_unit_within_flash_page refers to one of $2^k$ mapping-unit-size portions of each flash page (k being fixed for the entire nonvolatile memory). Sub-page address 104 is a combination of flash_page_address and mapping_unit_within_flash_page. For sector-based addressing, lower-order bits of the logical block address (e.g., LBA[U−1:0] 111) specify a sub-portion, such as a number of sectors (e.g., sector(s) within sub-page 113) within the mapping unit.

Figure 2:
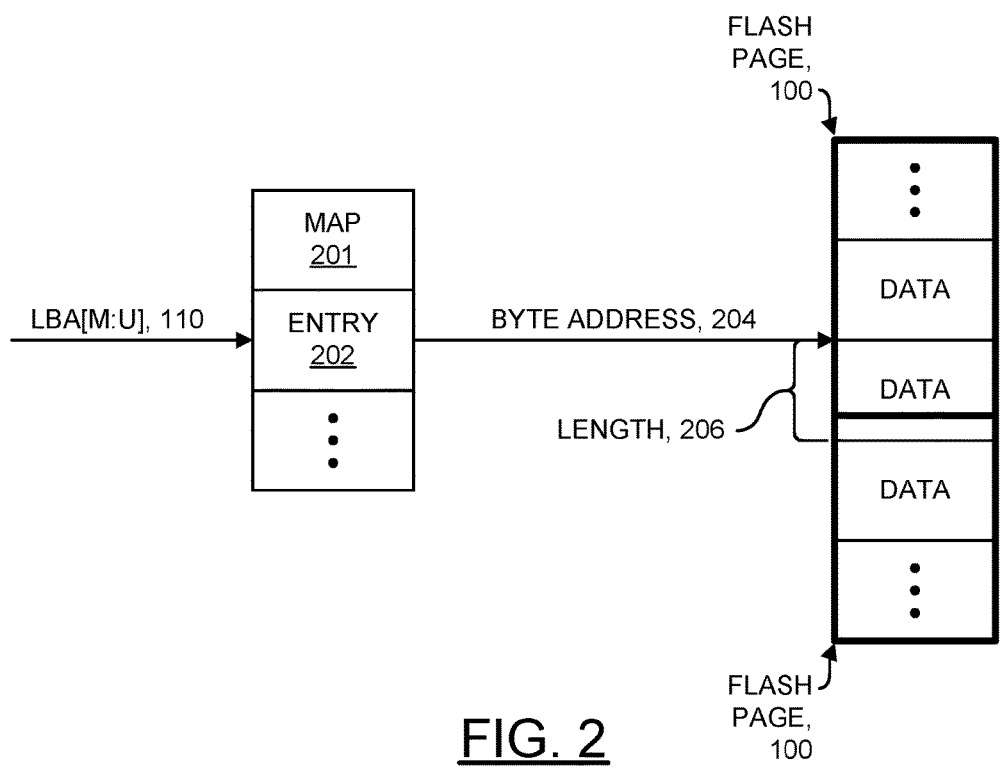
FIG. 2 is an illustration of selected details of an embodiment of mapping of a logical block address to a variable-sized region that optionally spans flash pages.

Referring to FIG. 2, an illustration of selected details of an embodiment of mapping of a logical block address to a variable-sized region that optionally spans flash pages is shown. Variable-size flash translation layers (e.g., VFTLs) conceptually map an address of a mapping unit (e.g., LBA [M:U] 110) to a variable-sized region of one or more flash pages (because, for example, data of the mapping unit is compressed prior to being stored in flash, and/or because, in another example, the mapping units are written by the host as variable-sized pieces, such as for an object store). However, providing a complete byte address 204 and byte data length 206 in each map entry makes the map entries large when compared with traditional flash translation layers.

Variable-size flash translation layers are used in some solid-state disks (e.g., SSDs). The solid-state disk systems have generally been designed for higher-end client and/or enterprise applications where random access performance constraints are a driving factor in the overall system design. To configure a variable-size flash translation layer for a low-end and/or mobile environment, changes may be implemented to configure for sequential performance as the driving factor. Embodiments of the invention provide one or more ways of organizing user data and VFTL meta-data to enable less expensive and more efficient low-end and mobile nonvolatile memory systems where sequential read performance is a dominant constraint.

Figure 3:
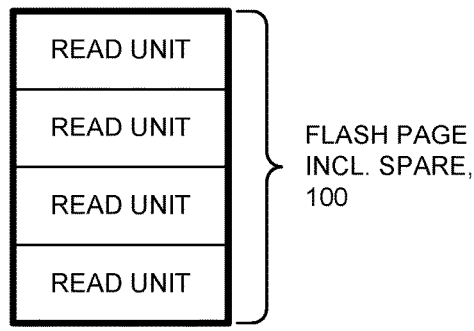
FIG. 3 is an illustration of an embodiment of a flash page comprising an integer number of read units.

Referring to FIG. 3, an illustration of an embodiment of a flash page comprising an integer number of read units is shown. In some embodiments, variable-size flash translation layers perform the mapping from addresses of mapping units to physical addresses by mapping to an Epage (e.g., ECC page) address, also termed a "read unit" address. An Epage (or read unit) is the minimum amount of data that can be read from the nonvolatile memory and corrected by the error correction code used to protect contents of the nonvolatile memory. That is, each read unit contains an amount of data and corresponding ECC check bytes that protect that data. In some embodiments, a flash page (such as flash page 100), or in other embodiments, a group of flash pages treated as a unit for purposes of writing, is divided into an integer number of read units, as illustrated in FIG. 3.

In various embodiments, the number of read units per flash page is allowed to vary. For example, some portions of the nonvolatile memory use stronger error correction code than others (using more bytes in the flash page for error correction coding), and have fewer read units and/or less usable data per read unit. In another example, the number of read units per flash page varies as the nonvolatile memory is used, since the program/erase cycles tend to weaken the nonvolatile memory, resulting in stronger error correction codes as the nonvolatile memory is used (worn) more.

According to various embodiments, the error correction code used is one or more of: a Reed-Solomon (e.g., RS) code; a Bose Chaudhuri Hocquenghem (e.g., BCH) code; a turbo code; a low-density parity-check (e.g., LDPC) code; a polar code; a non-binary code; a redundant array of inexpensive/independent disks (e.g., RAID) code; an erasure code; any other error correction code; any combination of the foregoing including compositions, concatenations, and interleaving. Typical codeword sizes range from 512 bytes (plus ECC bytes) to 2176 bytes (plus ECC bytes). Typical numbers of ECC bytes range from only a few bytes to several hundred bytes.

Figure 4:
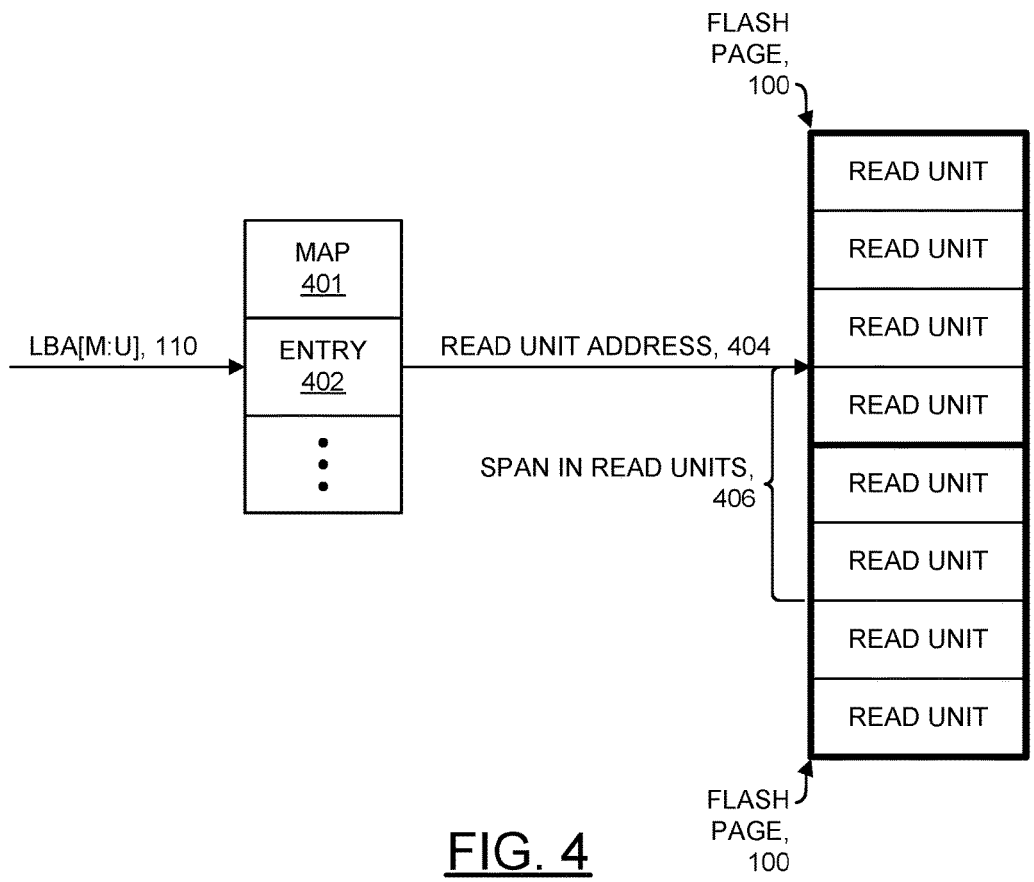
FIG. 4 is an illustration of selected details of an embodiment of mapping of a logical block address to a variable-sized region spanning one or more read units.

Referring to FIG. 4, an illustration of selected details of an embodiment of mapping a logical block address to a variable-sized region spanning one or more read units is shown. In some embodiments, VFTL mapping maps the address of a variable-sized (e.g., compressed) mapping unit (e.g., LBA[M:U] 110) to a number of read units, represented in each entry of the map as a read unit address 404 and a span (a number of read units) 406. The read units referenced by one of the map entries are in one or more (logically and/or physically) sequential flash pages, for example, the number of read units optionally and/or selectively cross a flash page boundary. An entry of the map alone is generally not sufficient to locate the associated data (as the entry only references the read units, and not a location of the data within the read units), and further information (such as headers) within the referenced read units is used to precisely locate the associated data.

In some embodiments, data is written into flash pages in a manner that is striped across multiple dies of the nonvolatile memory. Striping write data across multiple dies advantageously enables greater write bandwidth by only writing a flash page into a given die once per stripe. A stripe of blocks across multiple dies is termed a redundancy block, because in further embodiments and/or usage scenarios, RAID-like redundancy is added on a redundancy block basis using, for example, one redundant die. In various embodiments, some blocks of the nonvolatile memory are defective and are skipped on writing, so that the striping occasionally has "holes" where one of the die is skipped (rather than writing into flash pages of a bad block). In such embodiments, "sequential" flash pages are sequential in a logical order determined by an order in which the flash pages are written.

Figure 5:
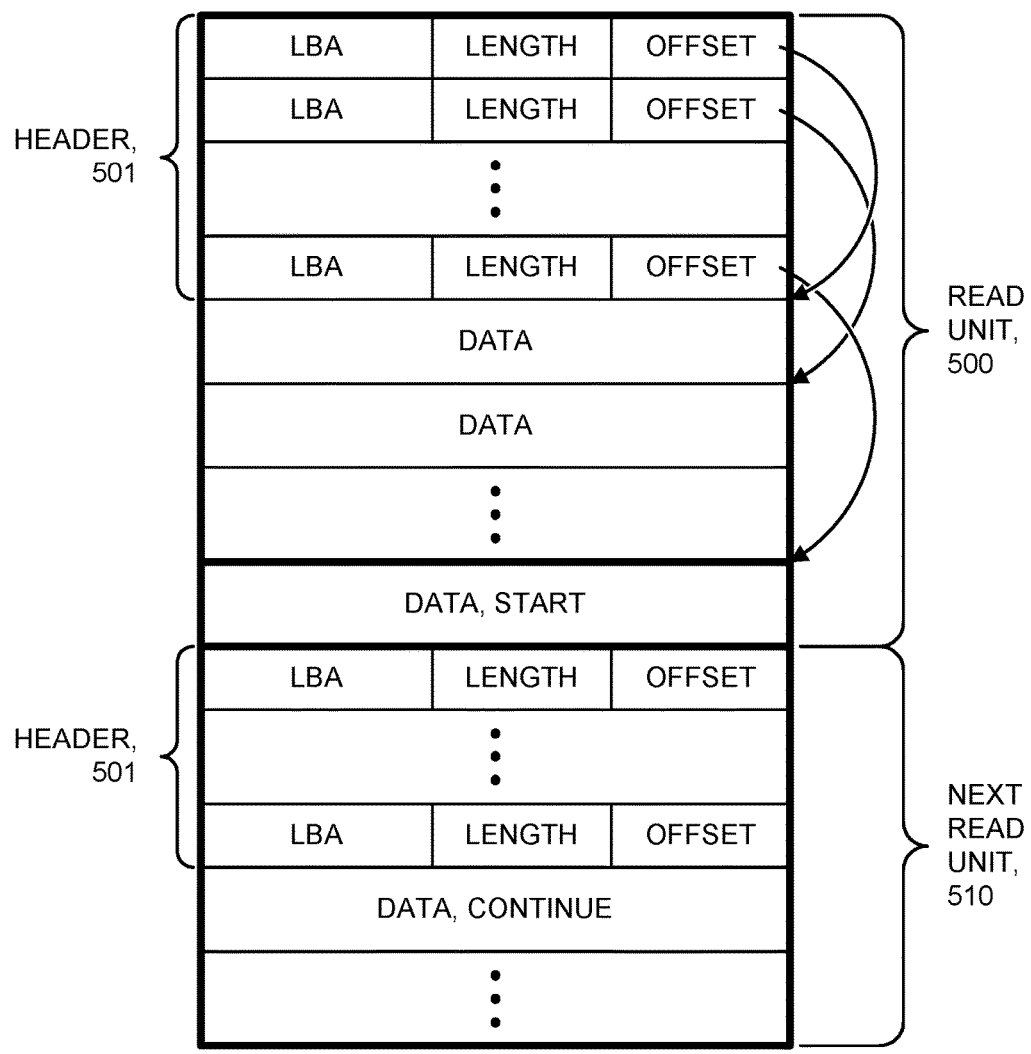
FIG. 5 is an illustration of selected details of an embodiment of a read unit comprising headers and data.

Referring to FIG. 5, an illustration of selected details of an embodiment of a read unit comprising headers and data is shown. In various embodiments, the mapping illustrated in FIG. 4 engenders a criterion to locate the variable-sized data within the read units. As illustrated in FIG. 5, each read unit (e.g., read units 500 and 510) has a set of headers 501, and the headers are written, typically by hardware, as the variable-sized data is "tiled" (e.g., densely packed without wasted space) into one or more read units. The headers are interpreted, typically by other hardware, to extract the variable-sized data when the nonvolatile memory is read. Variable-sized data is located by a respective offset and length in one of the headers having a matching logical block address, and data optionally and/or selectively spans read units (such as illustrated by the variable-sized data illustrated by "DATA, START" and "DATA, CONTINUE").

In various embodiments, the headers are also used as part of recycling (e.g., garbage collection)—including the logical block address (or equivalently, the mapping unit address) in the headers both enables finding the variable-sized data within a read unit, and provides a way to determine when a particular one of the read units is read, if the variable-sized data within is still valid or has been overwritten (by looking up the logical block address in the map and determining if the map still references a physical address of the particular read unit, or has been updated to reference another one of the read units).

In some embodiments, dedicated hardware to extract data from the read units based on the logical block addresses is implemented to operate with high efficiency for random reads. The dedicated hardware parses headers within one or more read units to find the one of the headers with a given logical block address, and then uses the respective length and offset to extract the associated variable-sized data. However, a hardware-based solution is costly (in silicon area and power). For a low-end and/or mobile environment where sequential performance is more important than random, changes are implemented to the variable-size flash translation layer to reduce silicon area, save power, and achieve high sequential throughput rates.

In some embodiments, a sequential-read-optimized variable-size flash translation layer (e.g., SRO-VFTL) tiles data into flash pages (or, in some embodiments, a group of flash pages treated as a unit for purposes of writing) without any gaps for headers within the data—all the headers are grouped in one portion of the flash page. In further embodiments, the headers are not used dynamically to access data (as in some variable-size flash translation layers), but are only used for recycling and recovery. Instead, entries of the map comprise complete information used to find variable-sized (e.g., compressed) data within the flash pages. Separating headers and data into different portions of the flash page leads to read units that comprise only headers, read units that comprise a mixture of headers and data (but only one such read unit per flash page), and read units that comprise only data.

While being configured for sequential read throughput at low cost, a sequential-read-optimized-variable-size flash translation layer is able to perform comparatively well on other metrics such as random read input/output operations per second (e.g., IOPs), random write input/output operations per second, and sequential write throughput. However, removal of hardware assists for functions such as VFTL-style data tiling with headers in each read unit places a larger burden on a control processor.

Figure 6:
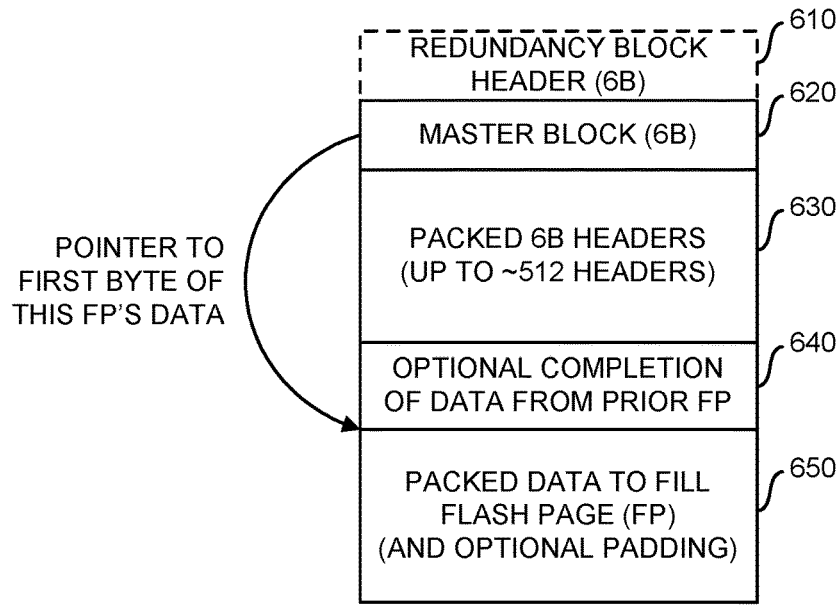
FIG. 6 is an illustration of selected details of an embodiment of a flash page comprising headers and data.
Figure 7:
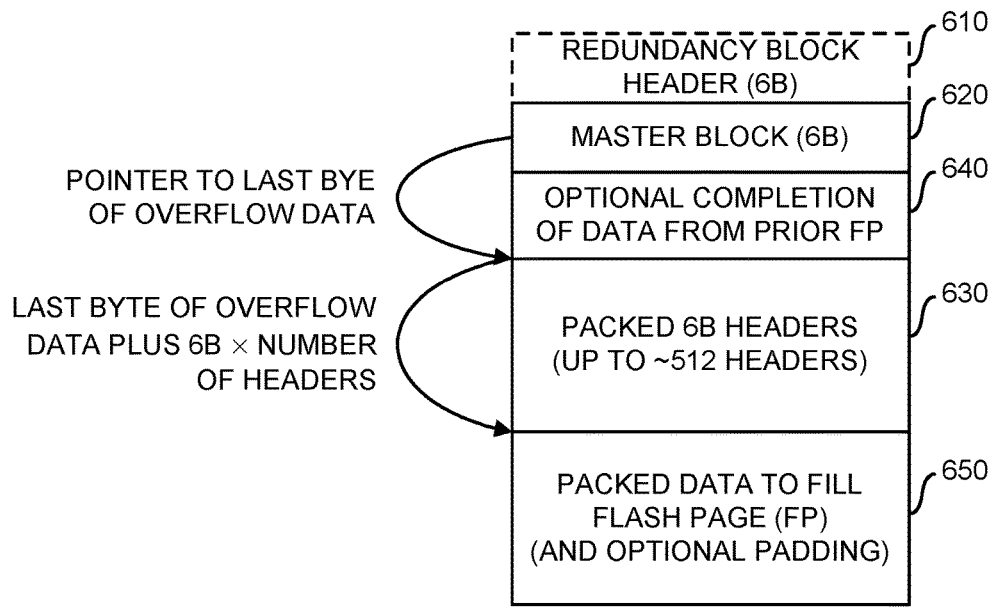
FIG. 7 is an illustration of selected details of an embodiment of a flash page comprising headers and data in accordance with an embodiment of the invention.

Referring to FIG. 6, an illustration of a first embodiment of an SRO-VFTL flash page is shown. Referring to FIG. 7, an illustration of a second embodiment of an SRO-VFTL flash page is shown in accordance with an embodiment of the invention. A difference between the embodiments of FIG. 6 and FIG. 7 is whether the continuation data from a previous flash page 640 is before or after the headers. Various embodiments and arrangements of the data within the flash page are contemplated.

According to various embodiments, a flash page comprises one or more of:

Headers, including a master header 610, optionally and/or selectively a redundancy block header 620 (e.g., a header added in the first page of each block in a redundancy block), and zero or more additional packed headers 630. Every flash page has at least a count of the number of followings headers and a pointer to where data (associated with the headers) start in the flash page. In some embodiments, the headers may be byte-aligned, but are only 6 bytes (e.g., B) each. The headers may include, but are not limited to, data headers, epoch headers and padding. Data headers utilize a mapping unit address and a length. The offset is implied because all data is consecutively packed.

Optionally and/or selectively continuation data from a previous flash page (a portion of variable-sized data of a mapping unit) 640.

Packed (e.g., optionally and/or selectively compressed) data of one or more mapping units 650 to fill the flash page, the last of which optionally and/or selectively continues in a subsequent flash page.

Optional padding at the end of the flash page (included in 650). In various embodiments, the data is byte-packed (e.g., no holes), though possibly padded at the end of the flash page if highly compressed (e.g., too many headers). Padding is, for example, used if: (i) the last variable-sized piece of data added to the flash page left fewer unused bytes than a size of a header (so a new header could not be added to begin another variable-sized piece of data) and (ii) optionally and/or selectively, a specified number of headers per flash page is exceeded (so the number of mapping units stored in the flash pages is limited by the specified number of headers and not by a size of data of the mapping units).

In some embodiments, recovery and/or recycling (e.g., garbage collection) with a sequential-read-optimized-variable-size flash translation layer is advantageously enabled to read and/or error correct and/or examine only a header portion of each of the flash pages, and not every read unit as in a non-sequential-read-optimized-variable-size flash translation layer. If recycling determines that data of a flash page may be rewritten, that data may also be read and may also be error corrected. In some embodiments, an entire flash page is read for recycling, but only the header portion is error corrected until a determination is made that some data in the flash page should be recycled.

In various embodiments, a number of headers per flash page is limited to bound a number of read units per flash page that may be read to ensure all the headers have been read from the nonvolatile memory. In the embodiment of FIG. 6, only a number of read units sufficient to contain the maximum number of headers are read. In the embodiment of FIG. 7, an additional number of read units are read to account for a largest size of data completing from a previous flash page (e.g., continuation data 640). The embodiment of FIG. 7, however, enables a number of reads units to access the completion of data from a previous flash page to be determined from the associated map entry, as the number of bytes in the completion of data is determinable based on the respective offset and length of the associated map entry, and the number of bytes of user (non-error correction code) data in the previous flash page. Further, the only headers prior to the completion of data are the optional redundancy block header (only present in known flash pages, such as the first page in each block) and the master header (always present in each flash page). In the embodiment of FIG. 6, to read the completion of data without having to access nonvolatile memory twice, the maximum number of headers are assumed to be present (or the entire flash page is read).

In some embodiments, the sequential-read-optimized-variable-size flash translation layer uses a single-level map having a plurality of map entries. In other embodiments, the sequential-read-optimized-variable-size flash translation layer uses a multi-level map, such as a two-level map having a first-level map (e.g., FLM) pointing to second-level map (e.g., SLM) pages, where each of the second-level map pages comprises a plurality of leaf-level map entries. In further embodiments, the multi-level map has more than two levels, such as three levels. In some embodiments and/or usage scenarios, use of a multi-level map enables only a relevant (e.g., in use) portion of the map to be stored (e.g., cached) in local (e.g., on-chip) memory, reducing a cost of maintaining the map. For example, if typical usage patterns have 1 gigabyte (e.g., GB) of the logical block address space active at any point in time, then only a portion of the map sufficient to access the active 1 GB portion of the logical block address space is locally stored for fast access versus being stored in the nonvolatile memory. References outside of the active portion of the logical block address space fetch requested portions of one or more levels of the multi-level map from the nonvolatile memory, optionally and/or selectively replacing other locally-stored portions of the map.

Each of the leaf-level map entries is associated with (corresponds to) an address of one of a plurality of mapping units. A logical block address is converted to a mapping unit address, such as by removing zero or more least-significant bits (e.g., LSBs) of the logical block address and/or adding a constant to the logical block address for alignment purposes, and the mapping unit address is looked up in the map to determine a corresponding entry of the map.

Referring to FIG. 8, an illustration of details of an embodiment of various types of headers is shown. In the example of FIG. 8, the headers have been formatted to fit in six bytes each. According to various embodiments, the various types of headers are one or more of: all of a same size; optionally and/or selectively of different sizes; each comprises a respective field specifying a size of the header; vary in size in different flash pages; and any combination of the foregoing.

According to various embodiments, the headers in the flash page comprise one or more of:

Data headers (810) indicating information associated with a variable-sized data portion. In some embodiments, data associated with a data header starts in a same flash page as the data header appears. In further embodiments and/or usage scenarios, if a flash page only has remaining space for a data header, all of the associated data starts in a subsequent flash page.

Map headers, such as second-level map (e.g., SLM) headers (820). The second-level map headers comprise a first-level map index (e.g., FLMI) to indicate (such as for second-level map recycling and/or recovery) which second-level map page is being stored.

Log/Checkpoint headers (820). Log/Checkpoint headers indicate data used for recycling, recovery, error handling, debugging, or other special conditions.

Epoch headers (830) are used as part of recovery to associate data with corresponding map/checkpoint information. Typically, there is at least one Epoch header per flash page.

Master headers (870) are used once per flash page to provide information as to a number of headers in the flash page and where non-header data starts within the flash page. Various techniques determine a start of non-header data, such as illustrated in the embodiments of FIG. 6 and FIG. 7.

Redundancy block headers (880) are used in certain flash pages, such as the first flash page in each block in a redundancy block.

Other types of headers (840), such as padding headers, checkpoint headers supporting larger lengths, etc.

In some embodiments, some headers comprise a TYPE field to provide multiple subtypes of the header. In various embodiments, some headers comprise a LEN (length) field containing a length of data associated with the header. In other embodiments, rather than a LEN field, some headers comprise an OFFSET (offset) field (not shown) containing an offset (within the flash page) to the end of data associated with the header. (If the last one of the variable-sized pieces of data spans a flash page, the OFFSET is an offset within a subsequent flash page or a number of bytes within the subsequent flash page.) Only one of a LEN field or an OFFSET field is generally implemented since with the variable-sized pieces of data packed with no wasted space, the starting location and ending location of each of the variable-sized pieces of data in a flash page is implied by the starting location of the first variable-sized pieces of data in the flash page (e.g., immediately after the headers as in FIG. 7), and the list of LEN or OFFSET fields.

Referring to FIG. 9, an illustration of selected details of an embodiment of a map entry 900 is shown. According to various embodiments, the entries of the map comprise one or more of:

A physical flash page address,

An offset within the flash page to a variable-sized data item,

A length of the variable-sized data item, and

Other control information.

In some embodiments, the length is encoded, for example by being offset such that a value of zero corresponds to a specified minimum length. In further embodiments, data that is compressed to less than the specified minimum length is padded to be at least the specified minimum length in size.

In various embodiments, the SRO-VFTL map entries are larger than VFTL map entries since the SRO-VFTL map entries store a full offset and byte length of corresponding data. Accordingly, reducing a size of the map entries when stored in the nonvolatile memory may be advantages. In typical use, data is often sequentially read and written, at least with some granularity and/or an average number of sequential mapping units greater than one, and a map entry compression format taking advantage of the sequential nature of writing is relatively inexpensive to implement and produces a high map compression rate. Compression of map entries is further aided by sequentially-written data going into same flash pages, until a flash page boundary is crossed.

Referring to FIG. 10, an illustration of selected details of an embodiment of various compressed map entries is shown. The various map entries include uncompressed (1010), having a same flash page address as a previous map entry (1020), having a same flash page address as the previous map entry and starting at an offset where the previous data ended (1030), and having a same flash page address as the previous map entry, starting at an offset where the previous data ended, and having a same length as the previous map entry (1040).

In some embodiments having a multi-level map, a cache is maintained of lower-level (such as leaf-level) map pages. The cached map pages are in an uncompressed form, providing quick access by the processor. When map pages are moved (such as from nonvolatile memory or dynamic random access memory (e.g., DRAM)) into the cache, the map pages are uncompressed. When the map pages are flushed from the cache (such as due to being modified), the map pages are compressed for storage (such as in the nonvolatile memory). According to various embodiments in which DRAM is used to reduce latency by storing some or all of the map pages in the dynamic random access memory, the map pages in the dynamic random access memory are stored in one or more of: compressed form; uncompressed form; a selectively compressed or uncompressed form; and with an indirection table used to access the compressed versions of the map pages in the dynamic random access memory.

In some embodiments, host write data of a host write command is optionally and/or selectively compressed as the host write data arrives, and stored in a first-in-first-out (e.g., FIFO)-like fashion in a local (such as an on-chip) memory. For example, in some embodiments the host write data is stored in a unified buffer (e.g., UBUF in FIG. 12), along with firmware data structures, flash statistics, portions of the map such as a cache holding one or more pages of the map, read data from the nonvolatile memory including recycling read data, headers of data to be written to the nonvolatile memory, firmware code, and other uses. In other embodiments, one or more dedicated memories are used for various local storage criteria of the solid-state drive.

With each mapping unit of data that arrives from the host, a control processor of the solid-state drive (e.g., central processing unit, CPU, in FIG. 12) is notified of one or more of: a respective mapping unit address, a respective local memory address, and/or a respective length of each mapping-unit of variable-sized (e.g., compressed) host data. The control processor is enabled to determine an order of writing of flash pages, and a total number of non-ECC bytes available in each of the flash pages. According to the total number of non-ECC bytes available in a given one of the flash pages, the control processor is enabled to determine an amount of headers and an amount of data placed in the given flash page. For example, the control processor accumulates headers for the given flash page (and tracks a number of bytes of headers used so far), and adds variable-sized data of mapping units and headers to the given flash page one at a time until the given flash page is full. When the given flash page is full, a last portion of data of a final one of the mapping units added to the given flash page possibly did not fit in the given flash page, and is used as a data completion portion of a subsequent one of the flash pages, reducing the total number of non-ECC bytes available in the subsequent flash page for new headers and data.

At a particular point in time, one or more flash pages are enabled to be filled with host write data, and one or more flash pages are enabled to be filled with recycled data. For example, at least two bands (e.g., FIFO-like series of redundancy blocks) may be filled, one band with "hot" data (e.g., fresh from the host) and the other band with "cold" data (e.g., recycled). Continuing the example, in various embodiments, the host write data is enabled to be directed into either the hot or the cold band, and recycled data is enabled to be directed into either the hot or the cold band.

The control processor is enabled to convert the series of respective mapping unit addresses, local memory addresses and lengths into one or more of: a series of headers to be written to a flash page as a header portion of the flash page; a first starting address and a first length of a sequential portion of the local memory to be written to the flash page as a user data portion of the flash page, the user data portion of the flash page comprising at least a portion of data of at least one mapping unit; a second starting address and a second length of a sequential portion of the local memory to be written to a subsequent flash page as a user data completion portion of the subsequent flash page, the user data completion portion comprising a portion of data of one mapping unit or being empty; a number of zero or more padding bytes to be written to the flash page, where the padding bytes are, for example, used if the user data completion portion is empty and the flash page is not full. Advantageously, the control processor is enabled to simply convert the series of respective mapping unit addresses, local memory addresses and lengths into the series of headers by reformatting, and to generate a small number of direct memory access (e.g., DMA) commands to transfer the portions comprising the flash page (the series of headers, a completion portion of a previous flash page, the user data portion, and any padding bytes) to the nonvolatile memory.

In various embodiments, compression of the host write data is optionally and/or selectively enabled. In a first example, information of the host write command selectively enables compression. In a second example, compression is selectively enabled as a function of a logical block address of the host write command. In a third example, compression is selectively disabled if compression of the host write data did not reduce a size of the host write data. If compression is not enabled, the host write data is stored uncompressed. According to various embodiments, entries of the map indicate if the corresponding data is compressed or uncompressed by one or more of: a respective bit in each entry of the map; and/or a value of the length stored in each map entry. For example, if mapping units are 4 KB, a length of 4 KB in a map entry indicates that associated data of the map entry is uncompressed, whereas a length less than 4 KB indicates that the associated data is compressed.

In some embodiments, data is recycled by selecting a redundancy block to be recycled, reading flash pages of the redundancy block in an order in which the flash pages were written, processing solely read units that contain headers of the flash pages, looking up a logical block address (or equivalently a mapping unit address) of each header that is a data header in the map to see if the data is still valid, and if the data is still valid constructing appropriate new headers and DMA commands to assemble the data to be recycled as part of a new flash page. The new flash page is then written to the nonvolatile memory.

Figure 11:
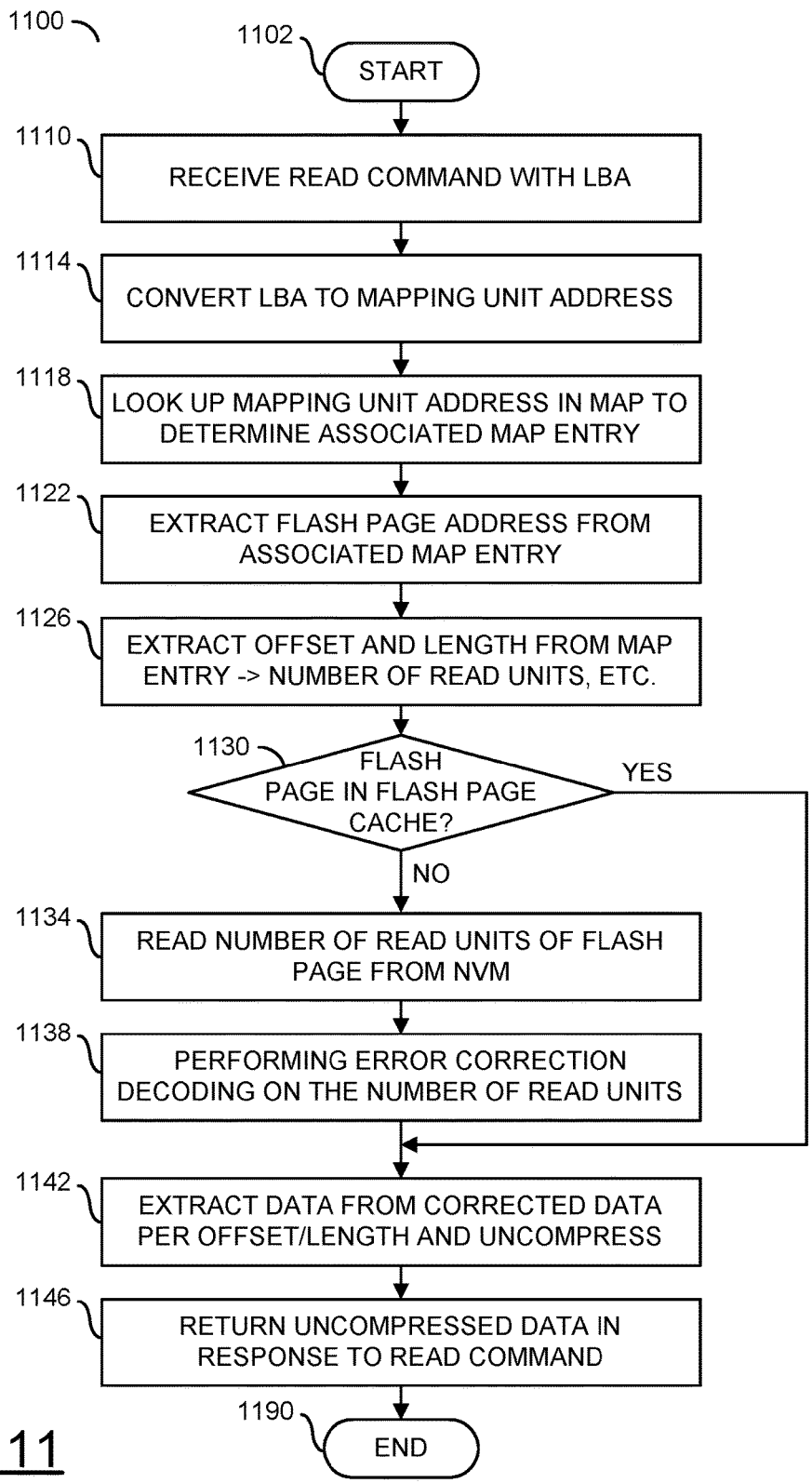
FIG. 11 is a flow diagram of reading a nonvolatile memory.

Referring to FIG. 11, an illustration of a flow diagram 1100 of reading a nonvolatile memory is shown. In contrast with the non-sequential-read-optimized variable-size flash translation layer, headers within the read units (or within the flash pages) are not used to extract read data. Both the non-sequential-read-optimized variable-size flash translation layer and the sequential-read-optimized-variable-size flash translation layer advantageously are enabled to access variable-sized data, and to only access the read units that contain the desired read data.

In some embodiments, in response to receiving a read command from the host comprising a logical block address (step 1110), the control processor and/or various hardware units are enabled to perform one or more of:

converting the logical block address to a mapping unit address (step 1114);

looking up the mapping unit address in a map comprising a plurality of map entries to determine an associated one of the map entries (step 1118);

extracting a respective flash page address of the associated map entry (step 1122) and determining if the associated flash page is in a flash page cache, or is read from the nonvolatile memory (step 1130);

extracting a respective offset and length from the associated map entry, and according to the respective offset and length, determining (step 1126):

a. number of a plurality of read units to access in the associated flash page, b. a read unit offset and total read unit length within the flash page of the accessed read units, and c. a DMA command to extract and process (such as by uncompressing) data associated with the mapping unit address from decoded versions of the accessed read units;

in response to determining that the associated flash page is not in the flash page cache, reading the accessed read units of the associated flash page from nonvolatile memory (step 1134), and performing error correction decoding on the accessed read units (step 1138) to produce corrected data;

extracting the associated data within the corrected data according to the respective offset and length of the associated map entry, and uncompressing the extracted data (step 1142); and providing the uncompressed data to the host in response to the read command (step 1146).

Typically for random read, the number of read units to access in the associated flash page to read the associated data is less than all of the read units in the associated flash page. Further, as the associated data is variable-sized, a number of read units to access in the associated flash page for a first read command referencing a first logical block address is different from a number of read units to access in the associated flash page for a second read command referencing a second logical block address, the second logical block address different from the first logical block address. In some embodiments, solely the number of read units to access in the associated flash page are read from the associated flash page. That is, only the ones of the read units that contain a portion of the associated data are read in order to access the associated data.

In some embodiments and/or usage scenarios, a particular one of the read units comprises at least a portion of data associated with a first logical block address, and at least a portion of data associated with a second different logical block address.

Figure 12:
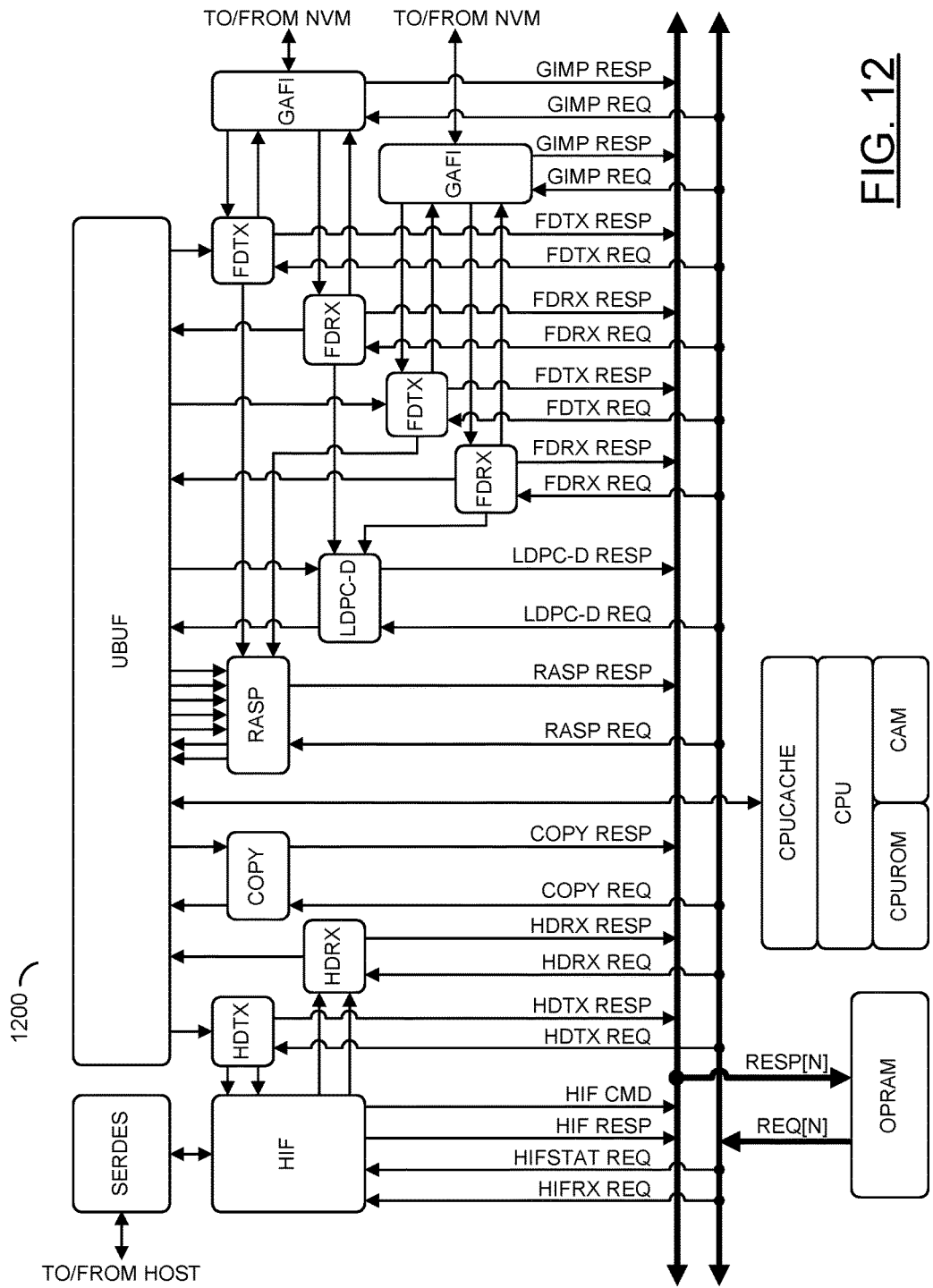
FIG. 12 is an illustration of selected details of an embodiment of a solid-state drive controller.

Referring to FIG. 12, an illustration selected details of an embodiment of a solid-state drive controller 1200 is shown. In some embodiments, the solid-state drive controller 1200 is enabled to implement a sequential-read-optimized-variable-size flash translation layer. In various embodiments, the controller 1200 may be implemented as one or more integrated circuits.

As illustrated in FIG. 12, a host interface (e.g., HIF), via an input/output receiver such as a SerDes (e.g., serialization-deserialization), receives commands, such as read and write commands, receives write data, and sends read data. Commands are sent to a CPU via a shared memory (e.g., OpRAM). The CPU interprets the commands and controls other portions of the SSD controller via the shared memory. For example, the CPU communicates DMA commands to and receives responses from various datapath transmit and receive units, such as the host receive datapath (e.g., HDRx) or the flash transmit datapath (e.g., FDTx), via the shared memory.

Write data from the host interface is transferred via a host receive datapath (e.g., HDRx) to a unified buffer (e.g., UBUF). In various embodiments, the host receive datapath includes logic to optionally and/or selectively compress and/or encrypt the host write data. The optionally and/or selectively compressed and/or encrypted host write data is then sent from the unified buffer to the nonvolatile memory via a flash transmit datapath (e.g., FDTx) and a generic flash interface (e.g., GAFI). In various embodiments, the flash transmit datapath includes logic to perform encryption and/or scrambling and/or error correction encoding. In response to host read commands, data is read from the nonvolatile memory via the generic flash interface (e.g., GAFI) and sent to the unified buffer via a flash receive datapath (e.g., FDRx). In various embodiments, the flash receive datapath incorporates error correction decoding and/or decryption and/or de-scrambling. In other embodiments, a separate error correction decoder (e.g., LDPC-D to implement LDPC codes) is enabled to operate on "raw" data stored in the unified buffer by the flash receive datapath. Decoded read data in the unified buffer is then sent to the host Interface via a host transmit datapath (e.g., HDTx). In various embodiments, the host transmit datapath includes logic to optionally and/or selectively decrypt and/or decompress decoded read data. In some embodiments, a RAID-like and soft-decision processing unit (e.g., RASP) is enabled to generate RAID-like redundancy to additionally protect host write data and/or system data stored in the nonvolatile memory, and/or to perform soft-decision processing operations for use with the LDPC-D.

According to various embodiments, any operations of the control processor are performed by any of one or more CPUs, by one or more hardware units, and/or by any combination of the foregoing. For example, for writing, conversion of the series of respective mapping unit addresses, local memory addresses and lengths into the series of headers is aided by hardware supplying the series of respective mapping unit addresses, local memory addresses and lengths in a format that is same as and/or similar to a format of the series of headers.

According to various embodiments, a solid-state drive controller coupled to a nonvolatile memory is enabled to use one or more of: a traditional flash translation layer; a variable-sized flash translation layer; a sequential read optimized variable-sized flash translation layer; any combination of the foregoing in different physical portions of the nonvolatile memory; any combination of the foregoing in different logical portions of a logical address space of the SSD controller; raw physical access to the nonvolatile memory; and any combination of the foregoing under control of a host coupled to the SSD controller.

According to various embodiments, host write data is optionally encrypted prior to being written to the nonvolatile memory, and decrypted after being read from the nonvolatile memory. In further embodiments, encryption happens subsequent to compression of the host write data, and decryption happens prior to decompression of data being read to return to the host.

While example embodiments have used solid-state drives, the techniques described herein are generally applicable to other input/output devices and/or data storage devices such as hard disk drives.

The following is a collection of example embodiments, including at least some explicitly enumerated example combinations (e.g., ECs), providing additional description of a variety of embodiment types in accordance with the concepts described herein; the examples are not meant to be mutually exclusive, exhaustive, or restrictive; and the invention is not limited to these example embodiments but rather encompasses all possible modifications and variations within the scope of the issued claims and their equivalents.

A method EC1 comprising: receiving, at an input/output device and via a host to input/output device interface, a read request to read data corresponding to a logical block address of the read request from nonvolatile memory of the input/output device; and in response to receiving the read request, reading a particular one of a plurality of entries of a map, the particular map entry associated with the logical block address of the read request, to obtain a physical address of a particular one of a plurality of pages of the nonvolatile memory, an offset in the particular page to compressed data previously stored in response to writing data corresponding to the logical block address, and a length in bytes of the compressed data, converting the offset in the particular page to the compressed data and the length in bytes of the compressed data to an address of a first one of a plurality of read units in the particular page and a number of the read units to be read from the particular page, reading from the particular page solely the number of read units, performing error correction decoding on each of the read units read from the particular page to obtain corrected data, extracting the compressed data from the corrected data according to the offset in the particular page to the compressed data and the length in bytes of the compressed data, decompressing the compressed data to produce return data, and returning the return data to the host.

A method EC2 comprising: receiving, at an input/output device and via a host to input/output device interface, a read request to read data corresponding to a logical block address of the read request from nonvolatile memory of the input/output device; and in response to receiving the read request, reading a particular one of a plurality of entries of a map, the particular map entry associated with the logical block address of the read request, to obtain a physical address of a particular one of a plurality of pages of the nonvolatile memory, an offset in the particular page to compressed data previously stored in response to writing data corresponding to the logical block address, and a length in bytes of the compressed data, converting the offset in the particular page to the compressed data and the length in bytes of the compressed data to an address of a first one of a plurality of read units in the particular page and a number of the read units to be read from the particular page, reading from the particular page at least the number of read units and less than all of the read units in the particular page, performing error correction decoding on each of the read units read from the particular page to obtain corrected data, extracting the compressed data from the corrected data according to the offset in the particular page to the compressed data and the length in bytes of the compressed data, decompressing the compressed data to produce return data, and returning the return data to the host.

A method EC3 according to EC1 or EC2, wherein the number of the read units to be read is less than all of the read units in the particular page.

A method EC4 according to either EC1 or EC2, further comprising: determining according to the offset in the particular page to the compressed data and the length in bytes of the compressed data combined with an amount of user data in the particular page that at least a portion of the compressed data is in one or more read units of a subsequent one of the pages of the nonvolatile memory.

A method EC5 according to EC4, wherein, in response to the update of the global redundant data on the second processing node, the respective local redundancy computation unit of the second processing node is enabled to compute second redundant data according to data of the update of the global redundant data for storing on at least some of the respective disks of the second processing node.

A method EC6 according to EC1 or EC2, wherein a first one of the pages of the nonvolatile memory comprises a first number of read units, a second one of the pages of the nonvolatile memory comprises a second number of read units, and the first number of read units is different from the second number of read units.

A method EC7 according to EC1 or EC2, wherein a first one of the pages of the nonvolatile memory comprises a first amount of user data, a second one of the pages of the nonvolatile memory comprises a second amount of user data, and the first number of user data is different from the second amount of user data.

A method EC8 according to EC1 or EC2, further comprising: receiving, at the input/output device and via the host to input/output device interface, a write request to write the data corresponding to the logical block address; in response to receiving the write request, compressing the data corresponding to the logical block address to form compressed write data that is smaller than the data corresponding to the logical block address, writing in the particular page at least a first portion of the compressed write data, and storing in the particular entry, the physical address of the particular page, the offset in the particular page to the compressed write data, and the length in bytes of the compressed write data.

A method EC9 according to EC8, further comprising: in response to receiving the request to write data, writing in the particular page a header, the header comprising at least a portion of the logical block address of the request and a length in bytes of the compressed data.

A method EC10 according to EC1 or EC2, wherein the logical block address is a first one of a plurality of logical block addresses, and at least one of the read units of the number of read units comprises at least some data corresponding to a different one of the logical block addresses.

A method EC11 according to EC1 or EC2, wherein at least one of the read units of the number of read units comprises one or more headers in addition to a portion of the compressed data.

A method EC12 comprising: receiving, at an input/output device and via a host to input/output device interface, a read request to read data corresponding to a logical block address of the read request from nonvolatile memory of the input/output device; and in response to receiving the read request, reading a particular one of a plurality of entries of a map, the particular map entry associated with the logical block address of the read request, to obtain a physical address of a particular one of a plurality of pages of the nonvolatile memory, an offset in the particular page to variable-sized data previously stored in response to writing data corresponding to the logical block address, and a length in bytes of the variable-sized data, converting the offset in the particular page to the variable-sized data and the length in bytes of the variable-sized data to an address of a first one of a plurality of read units in the particular page and a number of the read units to be read from the particular page, reading from the particular page solely the number of read units, performing error correction decoding on each of the read units read from the particular page to obtain corrected data, extracting the variable-sized data from the corrected data according to the offset in the particular page to the variable-sized data and the length in bytes of the variable-sized data, and returning the extracted data to the host.

A method EC13 according to EC1 or EC22, further comprising: receiving, at the input/output device and via the host to input/output device interface, a write request to write the variable-sized data corresponding to the logical block address and a size of the variable-sized data; in response to receiving the write request, writing in the particular page at least a first portion of the variable-sized data, and storing in the particular entry, the physical address of the particular page, the offset in the particular page to the variable-sized data, and the length in bytes of the variable-sized data according to the size of the variable-sized data.

In some embodiments, various combinations of all or portions of operations performed by a multi-node storage device or portion(s) thereof, for instance a hard disk drive or a solid-state disk controller of an input/output device enabled for interoperation with a processor (such as a CPU), an input/output controller (such as a RAID-on-chip die), and portions of a processor, microprocessor, system-on-a-chip, application-specific-integrated-circuit, hardware accelerator, or other circuitry providing all or portions of the aforementioned operations, are specified by a specification compatible with processing by a computer system. The specification is in accordance with various descriptions, such as hardware description languages, circuit descriptions, netlist descriptions, mask descriptions, or layout descriptions. Example descriptions include, but are not limited to: Verilog, VHDL, SPICE, SPICE variants such as PSpice, IBIS, LEF, DEF, GDS-II, OASIS, or other descriptions. In various embodiments, the processing includes any combination of interpretation, compilation, simulation, and synthesis to produce, to verify, or to specify logic and/or circuitry suitable for inclusion on one or more integrated circuits. Each integrated circuit, according to various embodiments, is designable and/or manufacturable according to a variety of techniques. The techniques include a programmable technique (such as a field or mask programmable gate array integrated circuit), a semi-custom technique (such as a wholly or partially cell-based integrated circuit), and a full-custom technique (such as an integrated circuit that is substantially specialized), any combination thereof, or any other technique compatible with design and/or manufacturing of integrated circuits.

In some embodiments, various combinations of all or portions of operations as described by a computer readable medium having a set of instructions stored therein, are performed by execution and/or interpretation of one or more program instructions, by interpretation and/or compiling of one or more source and/or script language statements, or by execution of binary instructions produced by compiling, translating, and/or interpreting information expressed in programming and/or scripting language statements. The statements are compatible with any standard programming or scripting language (such as C, C++, Fortran, Pascal, Ada, Java, VBscript, and Shell). One or more of the program instructions, the language statements, or the binary instructions, are optionally stored on one or more computer readable storage medium elements. In various embodiments, some, all, or various portions of the program instructions are realized as one or more functions, routines, subroutines, in-line routines, procedures, macros, or portions thereof.

Certain choices have been made in the description merely for convenience in preparing the text and drawings, and unless there is an indication to the contrary, the choices should not be construed per se as conveying additional information regarding structure or operation of the embodiments described. Examples of the choices include, but are not limited to: the particular organization or assignment of the designations used for the figure numbering and the particular organization or assignment of the element identifiers (e.g., the callouts or numerical designators) used to identify and reference the features and elements of the embodiments.

The words "includes" or "including" are specifically intended to be construed as abstractions describing logical sets of open-ended scope and are not meant to convey physical containment unless explicitly followed by the word "within".

Although the foregoing embodiments have been described in some detail for purposes of clarity of description and understanding, the invention is not limited to the details provided. There are many embodiments of the invention. The disclosed embodiments are exemplary and not restrictive.

Many variations in construction, arrangement, and use are possible consistent with the description, and are within the scope of the claims of the issued patent. For example, interconnect and function-unit bit-widths, clock speeds, and the type of technology used are variable according to various embodiments in each component block. The names given to interconnect and logic are merely exemplary, and should not be construed as limiting the concepts described. The order and arrangement of flowchart and flow diagram process, action, and function elements are variable according to various embodiments. Also, unless specifically stated to the contrary, value ranges specified, maximum and minimum values used, or other particular specifications (such as input/output device technology types, and the number of entries or stages in registers and buffers), are merely those of the described embodiments, are expected to track improvements and changes in implementation technology, and should not be construed as limitations.

Functionally equivalent techniques known in the art are employable instead of those described to implement various components, sub-systems, operations, functions, routines, subroutines, in-line routines, procedures, macros, or portions thereof. Many functional aspects of embodiments are realizable selectively in either hardware (e.g., generally dedicated circuitry) or software (e.g., via some manner of programmed controller or processor), as a function of embodiment dependent design constraints and technology trends of faster processing (facilitating migration of functions previously in hardware into software) and higher integration density (facilitating migration of functions previously in software into hardware). Specific variations in various embodiments include, but are not limited to: differences in partitioning; different form factors and configurations; use of different operating systems and other system software; use of different interface standards, network protocols, or communication links; use of different coding types; and other variations to be expected when implementing the concepts described herein in accordance with the unique engineering and business constraints of a particular application.

The embodiments have been described with detail and environmental context well beyond a minimal implementation of many aspects of the embodiments described. Those of ordinary skill in the art will recognize that some embodiments omit disclosed components or features without altering the basic cooperation among the remaining elements. Much of the details disclosed are not utilized to implement various aspects of the embodiments described. To the extent that the remaining elements are distinguishable from the prior art, components and features that are omitted are not limiting on the concepts described herein.

All such variations in design are insubstantial changes over the teachings conveyed by the described embodiments. The embodiments described herein have broad applicability to other computing and networking applications, and are not limited to the particular application or industry of the described embodiments. The invention is thus to be construed as including all possible modifications and variations encompassed within the scope of the claims of the issued patent.

The functions performed by the diagrams of FIGS. 1-12 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMs (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. A method for using a variable-size flash translation layer, comprising the steps of:
   reading an entry in a map based on a read logical block address in a read request to obtain both a physical address of a particular page in a memory and information regarding compressed data with a variable size, wherein the particular page comprises a plurality of read units;
   converting the information to both an offset in the particular page and a number of the read units in the memory that contain the compressed data, wherein the offset points from a start of the particular page to one of the plurality of read units in the particular page that is an initial one of the number of the read units that contain the compressed data; and
   reading stored data from at least the particular page in the memory based on the physical address of the particular page, the offset within the particular page and the number of the read units; and
   separating the compressed data from error correction code bits in the stored data based on the information in the entry read from the map.

2. The method according to claim 1, further comprising the step of:
   performing error correction decoding on the stored data prior to the separating of the compressed data from the error correction code bits.

3. The method according to claim 2, further comprising the steps of:
- decompressing the compressed data to generate read data; and
- transferring the read data to a host.

4. The method according to claim 1, further comprising the steps of:
- determining that at least a portion of the compressed data is in one or more subsequent read units in a subsequent page of the memory; and
- reading only the one or more subsequent read units from the subsequent page.

5. The method according to claim 1, further comprising the steps of:
- receiving a write request to store write data in the memory;
- compressing the write data to generate the compressed data;
- writing in the particular page at least a portion of the compressed data; and
- storing in the map the physical address of the particular page, the offset in the particular page to the compressed data, and a length of the compressed data.

6. The method according to claim 1, further comprising the steps of:
- receiving a write request to store write data in the memory; and
- writing in the particular page a header that includes at least a portion of a write logical block address of the write request.

7. The method according to claim 1, wherein at least one of the number of the read units includes at least some different data corresponding to another logical block address different than the read logical block address.

8. The method according to claim 1, wherein at least one of the number of the read units includes one or more headers and at least a portion of the compressed data.

9. The method according to claim 1, wherein the steps are performed in a solid-state drive.

10. An apparatus comprising:
- a memory configured to store data; and
- a controller configured to
  - process a plurality of input/output requests to read/write to/from the memory,
  - read an entry in a map based on a read logical block address in a read request to obtain both a physical address of a particular page in the memory and information regarding compressed data with a variable size, wherein the particular page comprises a plurality of read units,
  - convert the information to both an offset in the particular page and a number of the read units in the memory that contain the compressed data, wherein the offset points from a start of the particular page to one of the plurality of read units in the particular page that is an initial one of the number of the read units that contain the compressed data,
  - read stored data from at least the particular page in the memory based on the physical address of the particular page, the offset within the particular page and the number of the read units; and
  - separate the compressed data from error correction code bits in the stored data based on the information in the entry read from the map.

11. The apparatus according to claim 10, wherein the controller is further configured to
- perform error correction decoding on the stored data prior to the separation of the compressed data from the error correction code bits.

12. The apparatus according to claim 11, wherein the controller is further configured to
- decompress the compressed data to generate read data, and
- transfer the read data to a host.

13. The apparatus according to claim 10, wherein the controller is further configured to
- determine that at least a portion of the compressed data is in one or more subsequent read units in a subsequent page of the memory, and
- read only the one or more subsequent read units from the subsequent page.

14. The apparatus according to claim 10, wherein the controller is further configured to
- receive a write request to store write data in the memory,
- compress the write data to generate the compressed data,
- write in the particular page at least a portion of the compressed data, and
- store in the map the physical address of the particular page, the offset in the particular page to the compressed data, and a length of the compressed data.

15. The apparatus according to claim 10, wherein the controller is further configured to
- receive a write request to store write data in the memory, and
- write in the particular page a header that includes at least a portion of a write logical block address of the write request.

16. The apparatus according to claim 10, wherein at least one of the number of the read units includes at least some different data corresponding to another logical block address different than the read logical block address.

17. The apparatus according to claim 10, wherein at least one of the number of the read units includes one or more headers and at least a portion of the compressed data.

18. The apparatus according to claim 10, wherein the memory and the controller are part of a solid-state drive.

19. An apparatus comprising:
- an interface configured to process a plurality of read/write operations to/from a memory; and
- a control circuit configured to
  - read an entry in a map based on a read logical block address in a read request to obtain both a physical address of a particular page in the memory and information regarding compressed data with a variable size, wherein the particular page comprises a plurality of read units,
  - convert the information to both an offset in the particular page and a number of the read units in the memory that contain the compressed data, wherein the offset points from a start of the particular page to one of the plurality of read units in the particular page that is an initial one of the number of the read units that contain the compressed data,
  - read stored data from at least the particular page in the memory based on the physical address of the particular page, the offset within the particular page and the number of the read units; and separate the compressed data from error correction code bits in the stored data based on the information in the entry read from the map.

20. The apparatus according to claim 19, wherein the interface and the control circuit are part of a solid-state drive.

* * * * *